United States Patent
Okuno et al.

(10) Patent No.: US 10,636,499 B2
(45) Date of Patent: Apr. 28, 2020

(54) SEMICONDUCTOR DEVICE

(71) Applicant: TOSHIBA MEMORY CORPORATION, Minato-ku (JP)

(72) Inventors: Shinya Okuno, Yokohama (JP); Shigeki Nagasaka, Kawasaki (JP); Toshiyuki Kouchi, Kawasaki (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/422,112

(22) Filed: May 24, 2019

(65) Prior Publication Data

US 2019/0279727 A1    Sep. 12, 2019

Related U.S. Application Data

(63) Continuation of application No. 16/009,769, filed on Jun. 15, 2018, which is a continuation of application
(Continued)

(51) Int. Cl.
*G11C 16/04* (2006.01)
*G11C 16/32* (2006.01)
(Continued)

(52) U.S. Cl.
CPC .............. *G11C 16/32* (2013.01); *G06F 5/06* (2013.01); *G06F 13/1673* (2013.01); *G11C 7/02* (2013.01);
(Continued)

(58) Field of Classification Search
CPC ......... G11C 16/32; G11C 7/02; G11C 7/1012; G11C 7/1039; G11C 7/106; G11C 7/1066; G11C 16/12; G11C 16/10
See application file for complete search history.

(56) References Cited

U.S. PATENT DOCUMENTS 5,883,840 A    3/1999 Unruhe
6,144,604 A    11/2000 Haller
(Continued)

FOREIGN PATENT DOCUMENTS

CN    1828511 A    9/2006
CN    101213534 A    7/2008
(Continued)

OTHER PUBLICATIONS

U.S. Appl. No. 16/009,769, filed May 2019, Okuno, Shinya.*
Taiwan Office Action dated Oct. 14, 2016 in Taiwanese Patent Application No. 104128891 with English translation.

*Primary Examiner* — Pho M Luu
(74) *Attorney, Agent, or Firm* — Oblon, McClelland, Maier & Neustadt, L.L.P.

(57) ABSTRACT

A semiconductor device includes a memory circuit, a first FIFO, a second FIFO and an input/output circuit. The memory circuit outputs data. The first FIFO receives data from the memory circuit and outputs data synchronously with a first clock signal. The second FIFO receives data output from the first FIFO and outputs data synchronously with the first clock signal. The input/output circuit outputs data output from the second FIFO. The second FIFO is disposed in the vicinity of the input/output circuit than the first FIFO.

14 Claims, 9 Drawing Sheets

Related U.S. Application Data

No. 15/670,220, filed on Aug. 7, 2017, now Pat. No. 10,026,485, which is a continuation of application No. 15/384,714, filed on Dec. 20, 2016, now Pat. No. 9,754,676, which is a continuation of application No. 14/844,174, filed on Sep. 3, 2015, now Pat. No. 9,558,840.

(60) Provisional application No. 62/167,703, filed on May 28, 2015.

(51) Int. Cl.
*G11C 16/26* (2006.01)
*G11C 16/16* (2006.01)
*G11C 16/12* (2006.01)
*G11C 7/02* (2006.01)
*G11C 7/10* (2006.01)
*G11C 16/10* (2006.01)
*G06F 5/06* (2006.01)
*G06F 13/16* (2006.01)

(52) U.S. Cl.
CPC ............ *G11C 7/106* (2013.01); *G11C 7/1012* (2013.01); *G11C 7/1039* (2013.01); *G11C 7/1066* (2013.01); *G11C 16/10* (2013.01); *G11C 16/12* (2013.01); *G11C 16/16* (2013.01); *G11C 16/26* (2013.01); *G06F 2205/067* (2013.01); *G11C 16/0483* (2013.01); *G11C 2207/108* (2013.01); *G11C 2207/2281* (2013.01); *Y02D 10/14* (2018.01)

(56) References Cited

U.S. PATENT DOCUMENTS

| | | | |
|---|---|---|---|
| 6,622,224 B1 | 9/2003 | Cloud | |
| 6,662,224 B1 | 9/2003 | Cloud | |
| 7,106,098 B1 | 9/2006 | Zack | |
| 8,207,976 B2 | 6/2012 | Hein | |
| 8,335,878 B2 | 12/2012 | Lee et al. | |
| 8,339,891 B2 | 12/2012 | Arntzen et al. | |
| 8,630,129 B2 * | 1/2014 | Fujisawa | G11C 11/4087 365/189.05 |
| 8,644,086 B2 | 2/2014 | Ide et al. | |
| 8,913,459 B2 | 12/2014 | Kondo | |
| 9,026,761 B2 | 5/2015 | Mangano | |
| 9,285,826 B2 | 3/2016 | Kulick et al. | |
| 9,411,722 B2 | 8/2016 | Yap | |
| 9,472,253 B2 | 10/2016 | Narui | |
| 9,558,840 B2 * | 1/2017 | Okuno | G11C 16/10 |
| 9,754,676 B2 * | 9/2017 | Okuno | G11C 16/10 |
| 10,026,485 B2 * | 7/2018 | Okuno | G11C 16/10 |
| 2003/0189867 A1 | 10/2003 | Roohparvar et al. | |
| 2004/0205269 A1 | 10/2004 | Stolowitz | |
| 2005/0117403 A1 | 6/2005 | Fujisawa | |
| 2007/0076474 A1 | 4/2007 | Fujisawa | |
| 2009/0039492 A1 | 2/2009 | Kang et al. | |
| 2010/0223405 A1 | 9/2010 | Caltagirone et al. | |
| 2010/0238937 A1 | 9/2010 | Zhou et al. | |
| 2010/0296355 A1 | 11/2010 | Mochida | |
| 2013/0290615 A1 | 10/2013 | Shah | |
| 2019/0096447 A1 * | 3/2019 | Jang | G11C 7/1033 |

FOREIGN PATENT DOCUMENTS

| | | |
|---|---|---|
| JP | 4370507 | 11/2009 |
| JP | 2010-272168 | 12/2010 |
| JP | 4600825 | 12/2010 |
| JP | 2012-108590 A | 6/2012 |
| TW | 580709 B | 3/2004 |
| TW | 200641903 A | 12/2006 |
| TW | 201237593 A1 | 9/2012 |

* cited by examiner

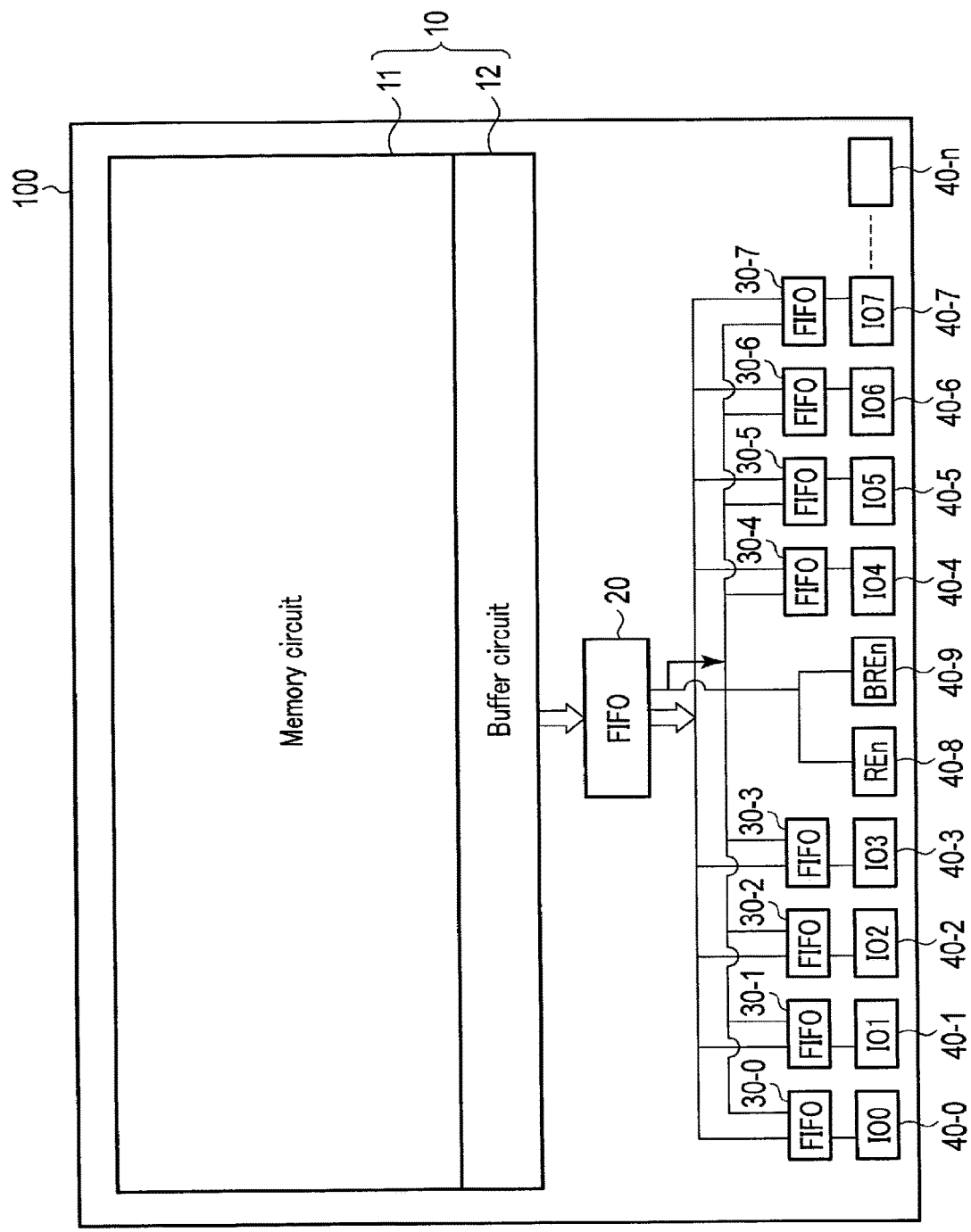
F I G. 1

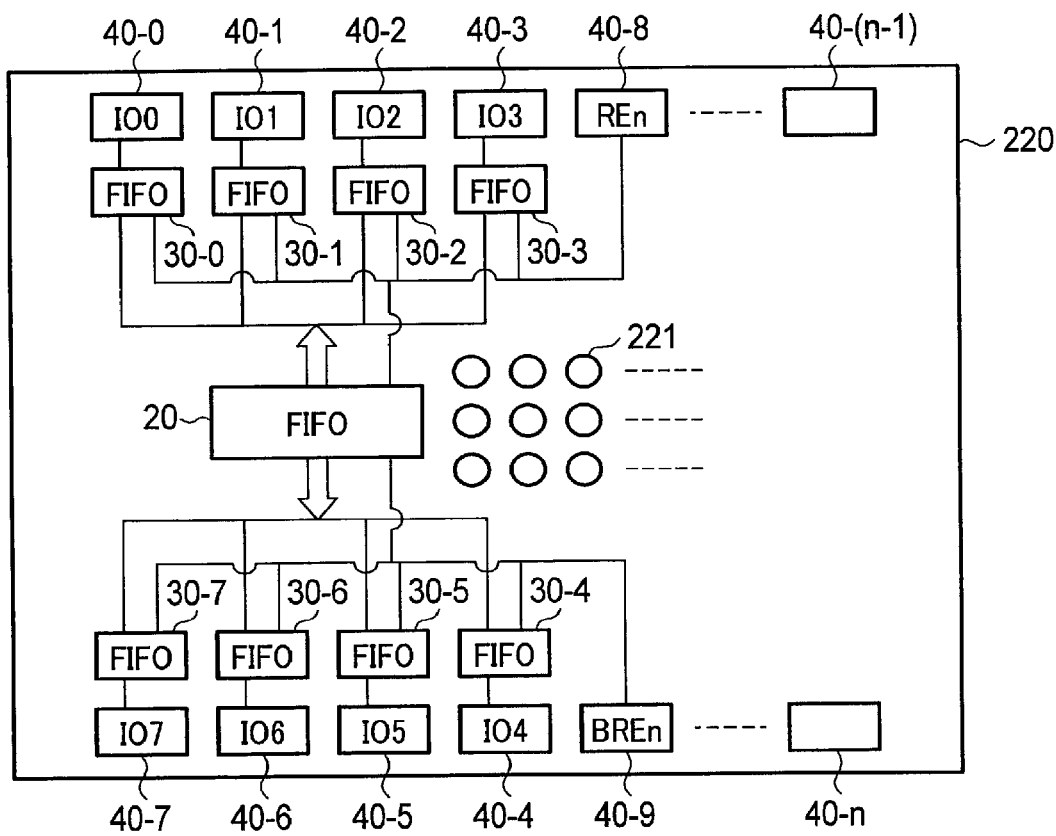
F I G. 3

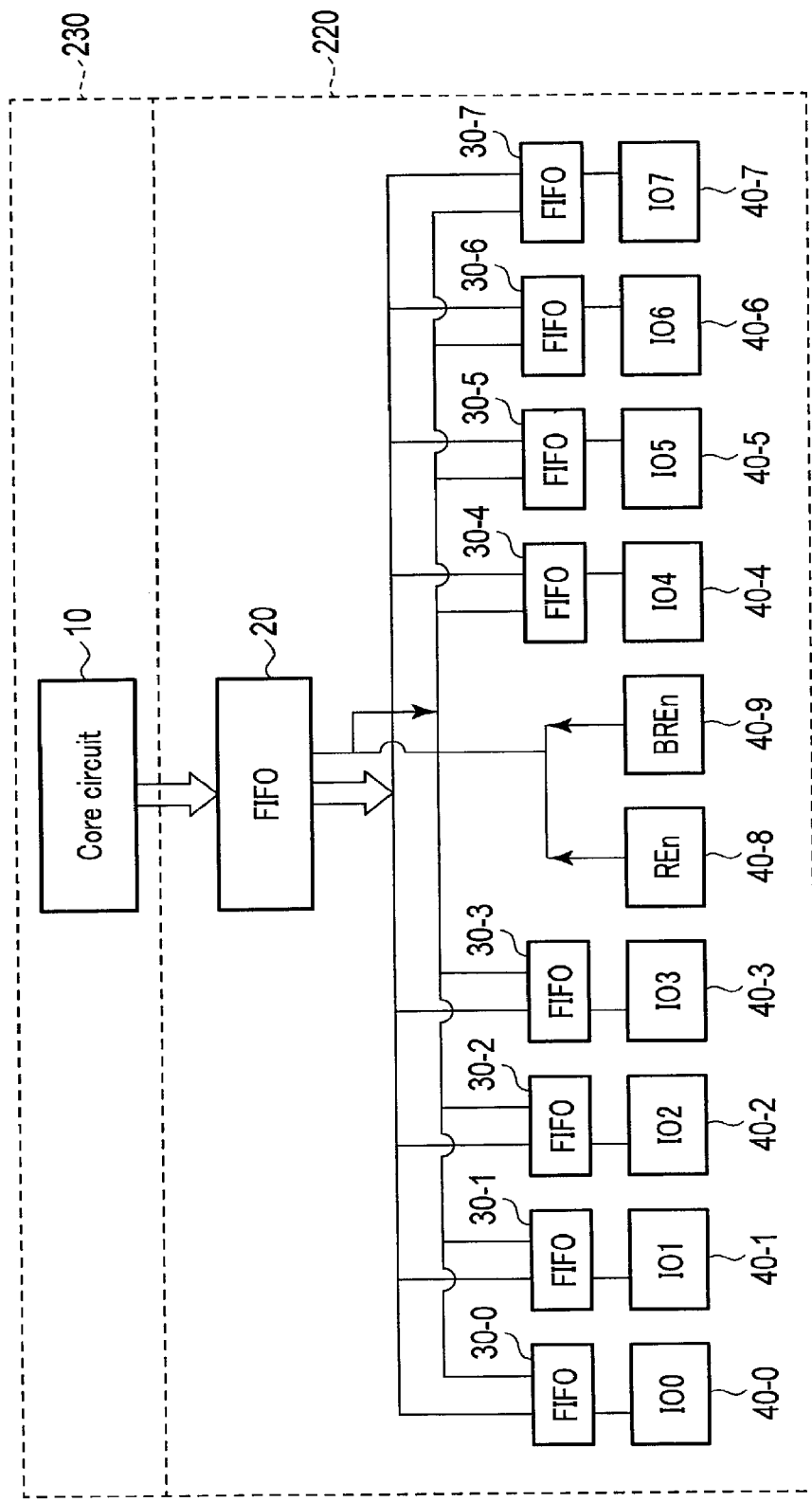
F I G. 4

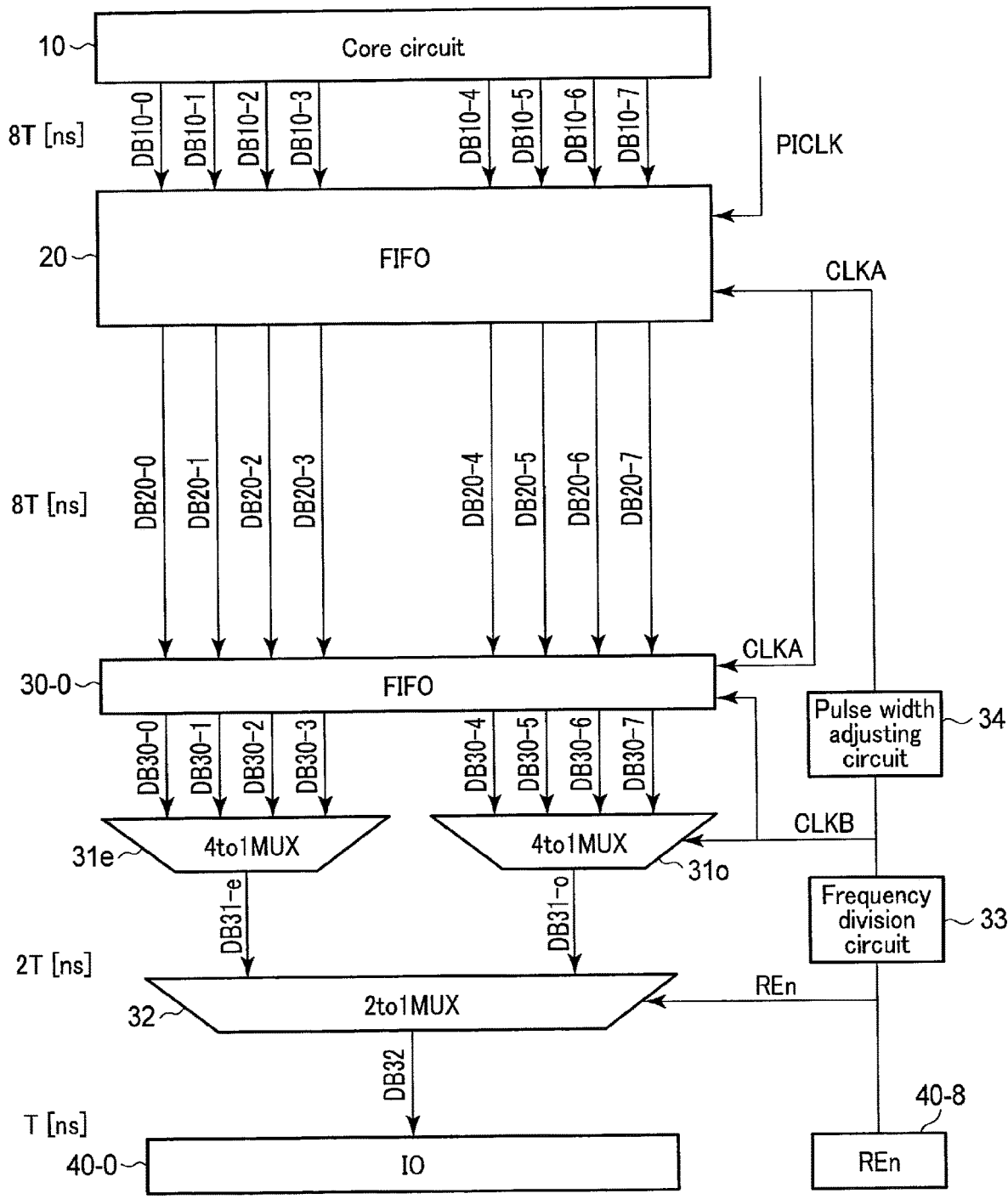
F I G. 5

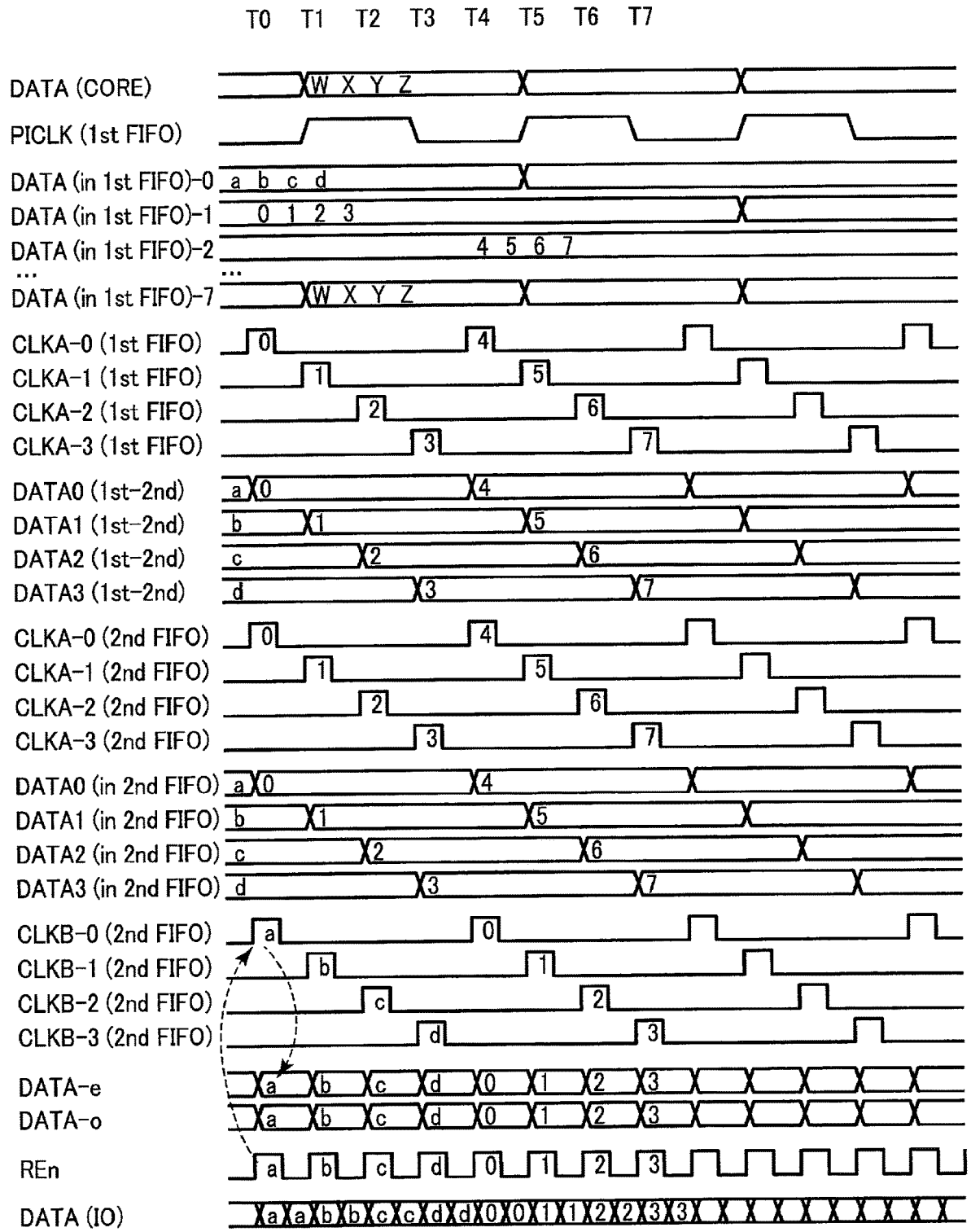
F I G. 6

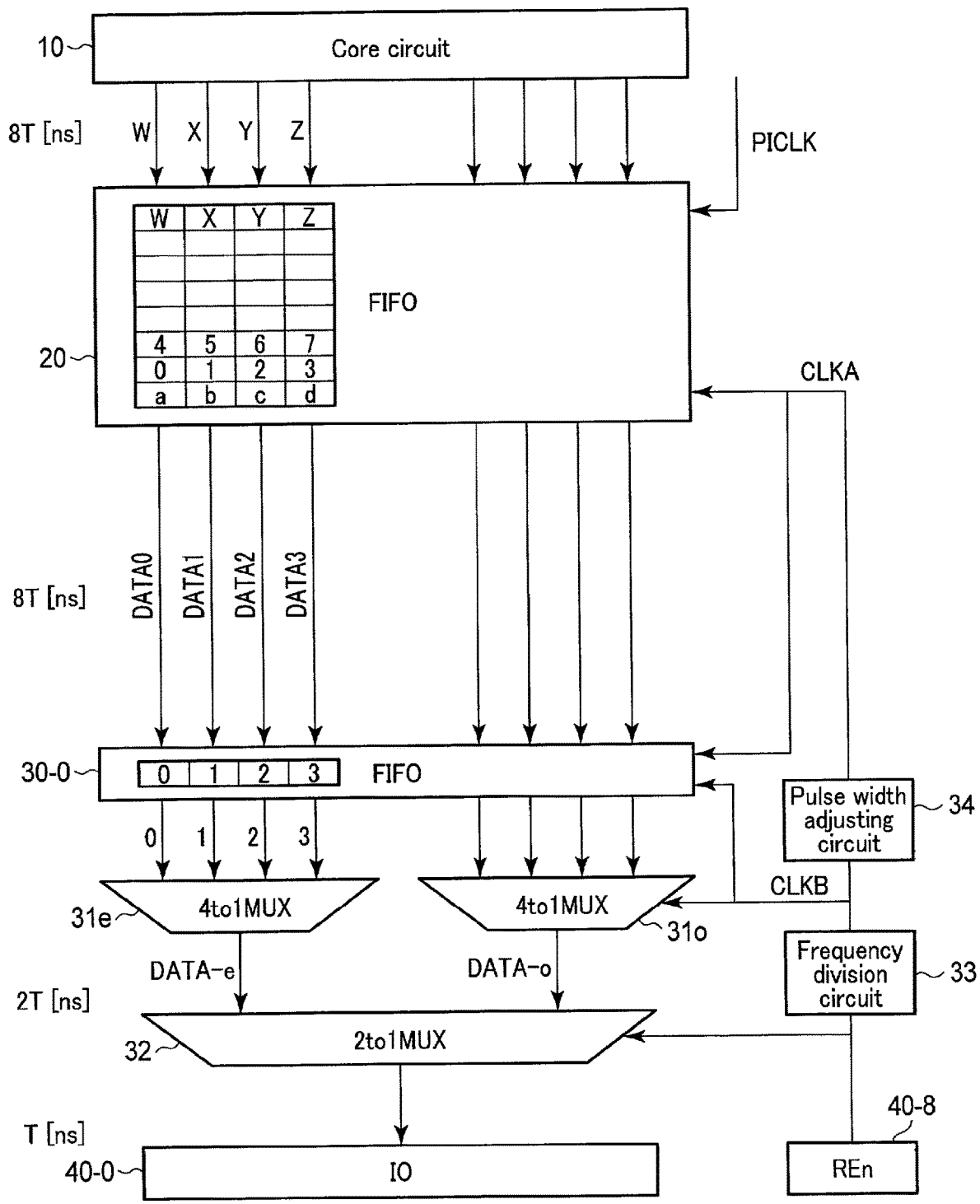
F I G. 7

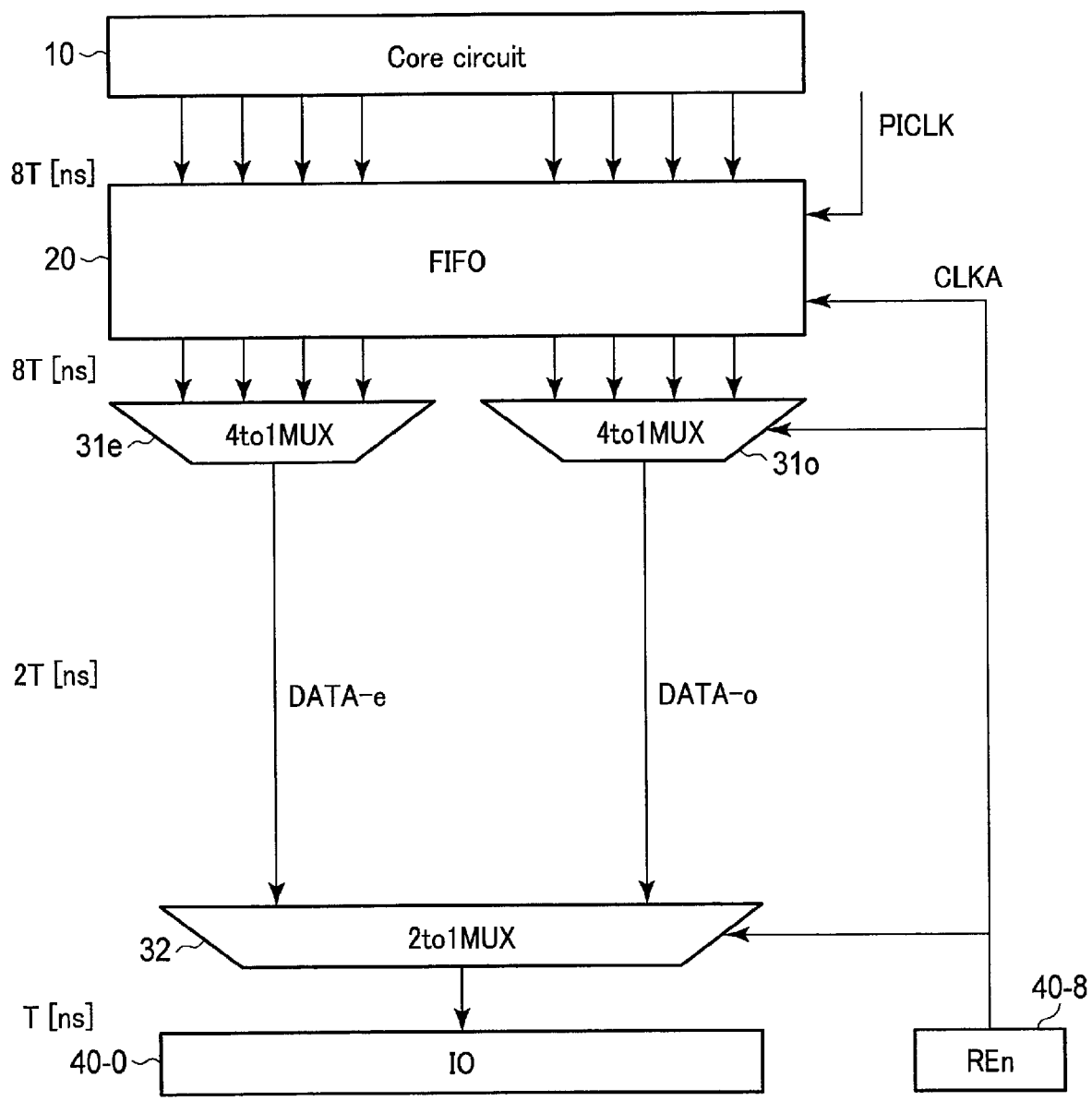
F I G. 8

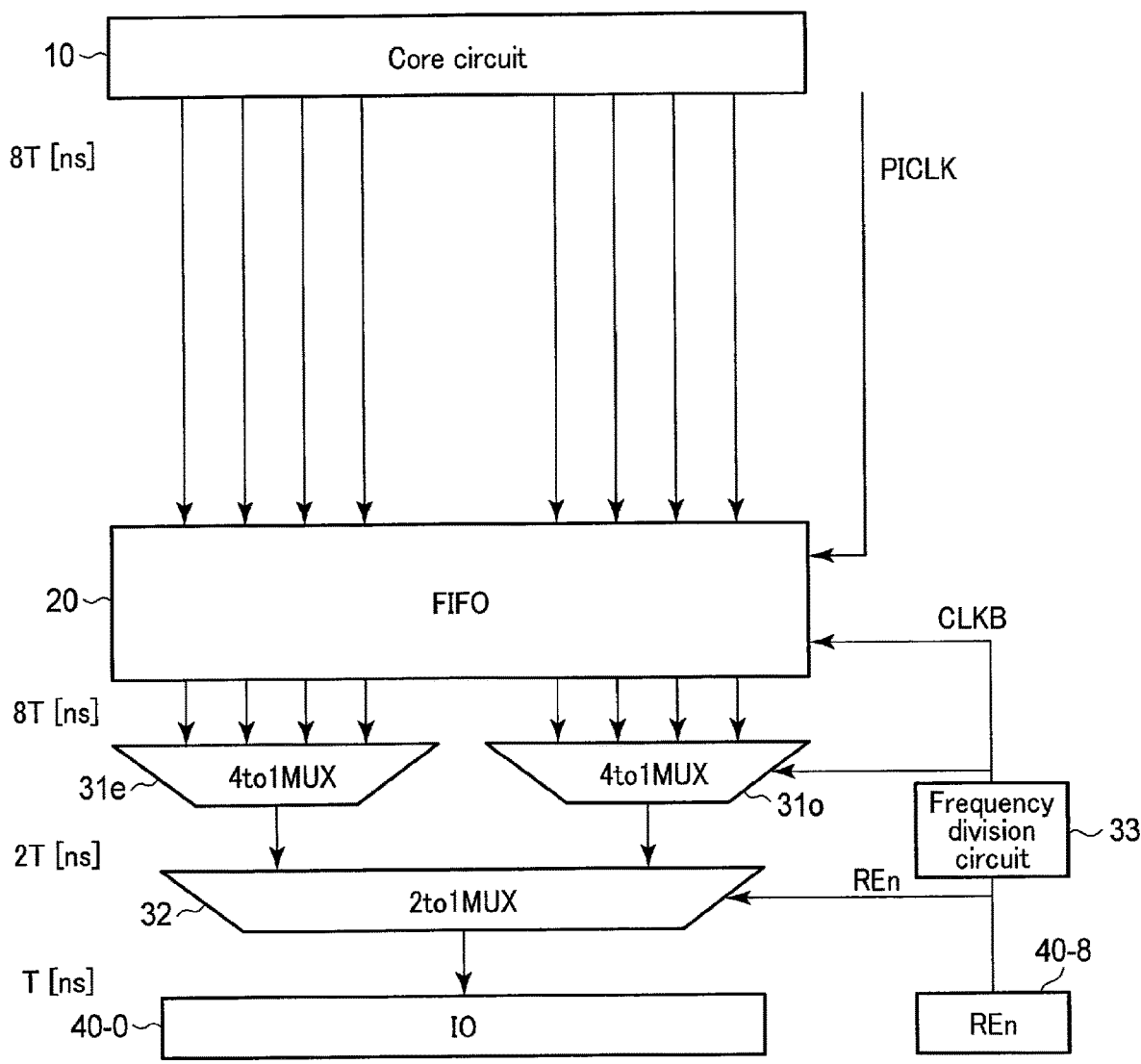
F I G. 9

SEMICONDUCTOR DEVICE

CROSS-REFERENCE TO RELATED APPLICATIONS

This is a continuation of U.S. application Ser. No. 16/009,769, filed Jun. 15, 2018, which is a continuation of U.S. application Ser. No. 15/670,220, filed Aug. 7, 2017 (now U.S. Pat. No. 10,026,485), which is a continuation of U.S. application Ser. No. 15/384,714, filed Dec. 20, 2016 (now U.S. Pat. No. 9,754,676), which is a continuation of U.S. application Ser. No. 14/844,174, filed Sep. 3, 2015 (now U.S. Pat. No. 9,558,840), which claims the benefit of U.S. Provisional Application No. 62/167,703, filed May 28, 2015, the entire contents of all of which are incorporated herein by reference.

FIELD

Embodiments described herein relate generally to a semiconductor device.

BACKGROUND

In recent years, in semiconductor devices, an increasingly large amount of data has been handled, and high-speed data transfer has been required. Data transferred to an input/output circuit from a core circuit and a clock for external reading asynchronously operate. Therefore, in the semiconductor devices, a FIFO (first-in first-out) circuit (hereinafter referred to as FIFO) is used to synchronize the data transfer and the clock for external reading. The FIFO is located to be as equidistant as possible from each input/output circuit, and data synchronized with a read clock is distributed and transferred to each input/output circuit.

BRIEF DESCRIPTION OF THE DRAWING

FIG. 1 is a layout diagram showing the circuit configuration of a semiconductor device according to a first embodiment;

FIG. 3 is a layout diagram showing the configuration of an interface chip of the multichip package shown in FIG. 2;

FIG. 4 is a schematic diagram showing the configuration from a core circuit to input/output pads in the semiconductor device according to the first embodiment;

FIG. 5 is a diagram showing the detailed configuration from the core circuit to the input/output pad according to the first embodiment;

FIG. 6 is a timing chart of clock signals and data input/output in the circuit shown in FIG. 5;

FIG. 7 is a diagram showing the state of data transfer adapted to the timing chart shown in FIG. 6;

FIG. 8 is a diagram showing the configuration from the core circuit to the input/output pad according to a comparative example; and FIG. 9 is a diagram showing the detailed configuration from the core circuit to the input/output pad according to a second embodiment.

DETAILED DESCRIPTION

Figure 2:
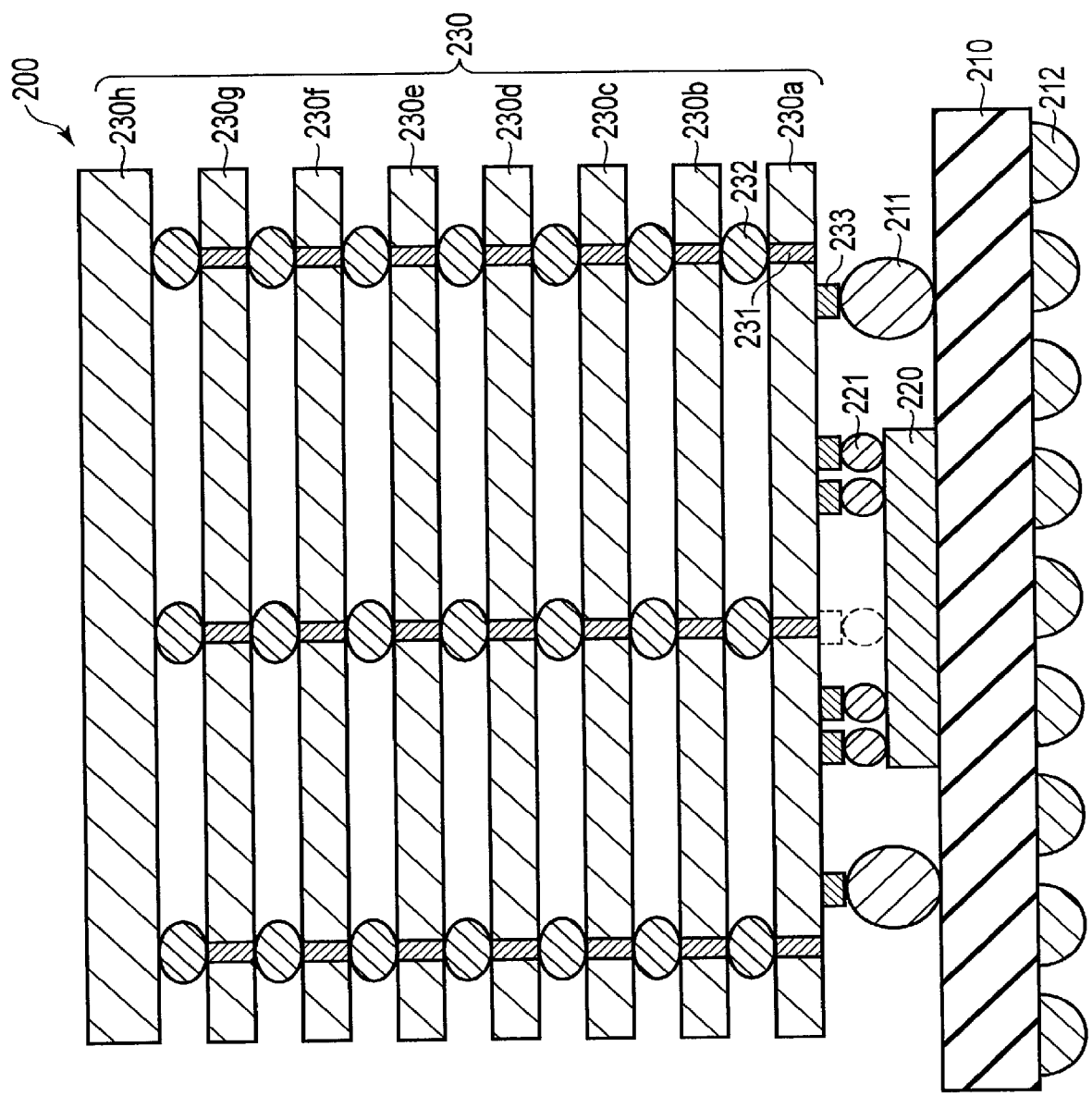
FIG. 2 is a diagram showing the sectional structure of a multichip package according to the first embodiment.

Hereinafter, semiconductor devices according to embodiments will be described below with reference to the drawings. In the following explanation, components having the same functions and configurations are provided with the same reference signs. The embodiments described below illustrate apparatuses and methods that embody the technical concept of the embodiments, and do not specify the materials, shapes, structures, and locations of the components to those described below.

In general, according to one embodiment, a semiconductor device includes a memory circuit, a first FIFO, a second FIFO and an input/output circuit. The memory circuit outputs data. The first FIFO receives data from the memory circuit and outputs data synchronously with a first clock signal. The second FIFO receives data output from the first FIFO and outputs data synchronously with the first clock signal. The input/output circuit outputs data output from the second FIFO. The second FIFO is disposed in the vicinity of the input/output circuit than the first FIFO.

1. First Embodiment

A semiconductor device according to a first embodiment is described.

1.1 Configuration of Semiconductor Device

FIG. 1 is a layout diagram showing the circuit configuration of the semiconductor device according to the first embodiment. A semiconductor device 100 includes a core circuit 10, a first FIFO (first-in first-out) 20, second FIFOs (first-in first-out) 30-0, 30-1, 30-2, and 30-7, input/output pads 40-0, 40-1, 40-2, and 40-7, and other pads 40-8, 40-9, . . . , and 40-n. The semiconductor device 100 includes one semiconductor chip. Here, n is a natural number equal to or more than 9.

The core circuit 10 includes a memory circuit 11 such as a NAND flash memory, and a buffer circuit 12. The memory circuit 11 has memory cells to store data. The buffer circuit 12 temporarily stores data read from the memory circuit 11 or data to be written into the memory circuit 11. The buffer circuit 12 outputs the stored data to the FIFO 20. At this point, the buffer circuit 12 transfers data to the FIFO 20 by a bus width of a first bit number (e.g., 64 bits).

The FIFO 20 stores data output from the buffer circuit 12. Further, the FIFO 20 outputs the stored data to the FIFOs 30-0 to 30-7 synchronously with read enable signals REn and BREn which are respectively supplied to the pads 40-8 and 40-9 from the outside. At this point, the FIFO 20 transfers data to the FIFOs 30-0 to 30-7 by the bus width of the first bit number (e.g., 64 bits). That is, the data transfer from the FIFO 20 to the FIFOs 30-0 to 30-7 is performed at the same bus width as the data transfer from the core circuit 10 to the FIFO 20.

The FIFOs 30-0 to 30-7 store data output from the FIFO 20. Further, the FIFOs 30-0 to 30-7 respectively output the stored data to the input/output pads 40-0 to 40-7 synchronously with the read enable signals REn and BREn.

The input/output pads 40-0 to 40-7 output data to the outside, or data are input thereto from the outside. As described above, the pads 40-8 and 40-9 are pads to which the read enable signals REn and BREn are supplied from the outside. The read enable signal BREn is a phase-inversion signal of the read enable signal REn. The pads 40-8 to 40-n are pads for inputting and outputting other power supplies or signals such as a power supply voltage VCC and a reference voltage (e.g., a ground voltage VSS), or commands.

1.2 Configuration of Another Semiconductor Device

An example of an application to a multichip package to ensure a high memory capacity is shown as another semiconductor device according to the first embodiment.

FIG. 2 is a diagram showing the sectional structure of the multichip package according to the first embodiment. A multichip package 200 is formed into a package so that an interface chip (semiconductor chip) 220 and a stack core chip 230 are arranged on a package substrate 210. The stack core chip 230 has stacked core chips (semiconductor chips) 230a, 230b, . . . , and 230h. The interface chip 220 is disposed between the package substrate 210 and the stack core chip 230. A through silicon via (TSV) method is used as a method of stacking the core chips 230a to 230h.

The configuration of the multichip package 200 is described in detail below. The interface chip 220 is provided on the upper surface of the package substrate 210. The stack core chip 230 is provided above the upper surfaces of the interface chip 220 and the package substrate 210.

The stack core chip 230 includes the core chips 230a to 230h. The core chips 230a to 230h are stacked in order from the lower side (the side of the package substrate 210). Each of the core chips 230a to 230g except for at least the uppermost core chip 230h is provided with a TSV (through silicon via) 231 which reaches the lower surface from the upper surface. The TSV 231 is a via which electrically conducts from the upper surface to the lower surface of each core chip. Bumps 232 are provided between the TSVs 231. The TSV 231 and the bump 232 electrically connect each of the core chips 230a to 230h and the interface chip 220.

An interconnect layer 233 is provided on the lower surface of a lowermost core chip 220a. A bump 221 is provided between the interconnect layer 233 and the interface chip 220. On the other hand, a bump 211 is provided between the interconnect layer 233 and the package substrate 210. For example, the core chip 230a is electrically connected to the interface chip 220 via the TSV 231 and the bump 221. The core chip 230b is electrically connected to the interface chip 220 via a first TSV 231, the bump 232, a second TSV 231, and the bump 221.

A bump 212 is provided on the lower surface of the package substrate 210. When the semiconductor device is a BGA package, the bump 212 is a solder ball. The package substrate 210 is electrically connected to the outside via the bump 212.

The stack core chip 230 includes a core circuit, a memory circuit such as a NAND flash memory, and a memory controller which controls the memory circuit. The memory circuit stores data or outputs stored data. That is, the stack core chip 230 stores, for example, external data or outputs stored data to the interface chip 220.

The interface chip 220 includes an interface circuit. The interface circuit comprises a logic circuit, an analog circuit, and others. The interface chip 220 transfers data, and other power supplies or signals, such as the power supply voltage VCC and the reference voltage (e.g., the ground voltage VSS), or the commands between the package substrate 210 and the stack core chip 230.

The package substrate 210 outputs, to the outside, data output from the interface chip 220. Data, other power supplies or signals, such as the power supply voltage VCC, the ground voltage VSS, or the commands are supplied to the package substrate 210 from the outside. The package substrate 210 supplies data to the stack core chip 230 via the interface chip 220. The package substrate 210 supplies the power supply voltage VCC or the ground voltage VSS to the stack core chip 230 via the interface chip 220 or directly.

FIG. 3 is a layout diagram showing the configuration of the interface chip 220 of the multichip package 200 shown in FIG. 2. The interface chip 220 comprises the bump 221, the first FIFO 20, the second FIFOs 30-0, 30-1, 30-2, and 30-7, the input/output pads 40-0, 40-1, 40-2, . . . , and 40-7, and the other pads 40-8, 40-9, . . . , 40-($n$−1) and 40-$n$.

The bump 221 is connected to the memory circuit of the stack core chip 230. Further, the bump 221 is connected to the FIFO 20. The other FIFOs 30-0 to 30-7, the input/output pads 40-0 to 40-7, and the pads 40-8 to 40-$n$ are different in layout on the interface chip 220, but are similar in connection and function to the above-described semiconductor device shown in FIG. 1.

The FIFO 20 in the interface chip 220 receives data from the memory circuits of the core chips 230a to 230h in the stack core chip 230, and transfers the received data to the FIFOs 30-0 to 30-7. One interface chip 220 is provided for the core chips 230a to 230h. The interface chip 220 is a chip shared by the core chips 230a to 230h.

1.3 Configuration from Core Circuit to Input/Output Pads

FIG. 4 is a schematic diagram showing the configuration from the core circuit 10 to the input/output pads 40-0 to 40-9 in the multichip package 200 according to the first embodiment. The core circuit 10 in the stack core chip 230 outputs stored data to the FIFO 20 in the interface chip 220. At this point, the core circuit 10 transfers data to the FIFO 20 by the bus width of the first bit number (e.g., 64 bits). That is, the stack core chip 230 transfers data to the interface chip 220 via the first TSV 231 by the bus width of the first bit number (e.g., 64 bits). The FIFO 20 holds data output from the core circuit 10. The read enable signals REn and BREn are supplied as read clock signals to the FIFO 20 from the outside via the pads 40-8 and 40-9. Although any one of the read enable signals REn and BREn may be used, the read enable signal REn is used here.

The FIFO 20 outputs the held data to the FIFOs 30-0 to 30-7 synchronously with the read enable signal REn. At this point, the FIFO 20 transfers data to the FIFOs 30-0 to 30-7 by the bus width of the first bit number (e.g., 64 bits). That is, the data transfer from the FIFO 20 to the FIFOs 30-0 to 30-7 in the interface chip 220 is performed at the same bus width as the data transfer from the stack core chip 230 to the interface chip 220. The FIFOs 30-0 to 30-7 hold data output from the FIFO 20.

The read enable signals REn and BREn are supplied to the FIFOs 30-0 to 30-7 as read clock signals. The FIFOs 30-0 to 30-7 respectively output the held data to the input/output pads 40-0 to 40-7 synchronously with the read enable signal REn. Each of the FIFOs 30-0 to 30-7 is located closer to the side of each of the input/output pads 40-0 to 40-7 than the middle point of the interconnect line between the FIFO 20 and each of the input/output pads 40-0 to 40-7. Multiplexers and the input/output circuit are disposed between the FIFOs 30-0 to 30-7 and the input/output pads 40-0 to 40-7, but are omitted here.

Next, the configuration from the core circuit 10 to one input/output pad 40-0 shown in FIGS. 1 and 4 is described in detail. The configuration from the core circuit 10 to each of the other input/output pads 40-1, 40-2, and 40-7 is similar to the configuration from the core circuit 10 to the input/output pad 40-0. Data are transferred by a 64-bit bus width from the core circuit 10 to the FIFO 20 and from the FIFO 20 to the FIFOs 30-0 to 30-7. Here, the FIFOs 30-0 to 30-7 consist of 8 FIFOs, so that the bus width is ⅛ between the FIFO 20 and the FIFO 30-0, and data are transferred by an 8-bit bus width. Similarly, the bus width is also ⅛ between the FIFO 20 and each of the FIFOs 30-1 to 30-7, and data are transferred by an 8-bit bus width.

FIG. 5 is a diagram showing the detailed circuit configuration from the core circuit 10 to the input/output pad 40-0. Here, the bus width is 8 bits between the FIFO 20 and the FIFO 30-0, so that the part between the core circuit 10 and the FIFO 20 is indicated by an 8-bit bus width corresponding to the FIFO 30-0. As shown, the core circuit 10 and the FIFO 20 are connected to each other by data buses DB10-0, DB10-1, DB10-2, . . . , and DB10-7. The FIFO 20 and the FIFO 30-0 are connected to each other by data buses DB20-0, DB20-1, DB20-2, . . . , and DB20-7.

Multiplexers 31e and 31o are disposed between the FIFO 30-0 and the input/output pad 40-0. A multiplexer 32 is disposed between the multiplexers 31e and 31o and the input/output pad 40-0. That is, the multiplexers 31e and 31o are disposed in parallel at the subsequent stage of the FIFO 30-0, and the multiplexer 32 is disposed at the subsequent stage of the multiplexers 31e and 31o.

The FIFO 30-0 and the multiplexer 31e are connected to each other by data buses DB30-0, DB30-1, DB30-2, and DB30-3. The FIFO 30-0 and the multiplexer 31o are connected to each other by data buses DB30-4, DB30-5, DB30-6, and DB30-7. The multiplexers 31e and 31o and the multiplexer 32 are connected to each other by data buses DB31-e and DB31-o, respectively. Moreover, the multiplexer 32 and the input/output pad 40-0 are connected to each other by a data bus DB32.

The multiplexer 31e selects and outputs one of the four data input through the data buses DB30-0, DB30-1, DB30-2, and DB30-3. The multiplexer 31o selects and outputs one of the four data input through the data buses DB30-4, DB30-5, DB30-6, and DB30-7. The multiplexer 32 selects and outputs one of the two data input through the data buses DB31-e and DB31-o.

The read enable signal REn is supplied to the pad 40-8 from the outside. The read enable signal REn supplied to the pad 40-8 is supplied to the multiplexer 32.

A frequency division circuit 33 and a pulse width adjusting circuit 34 are connected in order to an interconnect line which is connected to the pad 40-8 and which transmits the read enable signal REn. The frequency division circuit 33 frequency-divides the read enable signal REn into, for example, four, and supplies a frequency-divided clock signal CLKB to the multiplexers 31e and 31a The pulse width adjusting circuit 34 adjusts the pulse width of the clock signal CLKB frequency-divided by the frequency division circuit 33, and supplies an adjusted clock signal CLKA to the FIFO 20 and the FIFO 30-0. Specifically, the pulse width adjusting circuit 34 elongates the "H (high)" part of the pulse of the clock signal CLKB to adjust the pulse width so that the FIFO 20 and the FIFO 30-0 may normally operate even when a pulse waveform is slightly deformed.

1.4 Circuit Operation from Core Circuit to Input/Output Pads

FIG. 6 is a timing chart of the clock signals and data input/output in the circuit shown in FIG. 5. FIG. 7 is a diagram showing the state of data transfer adapted to the timing chart shown in FIG. 6.

The core circuit 10 holds even-side data and odd-side data. The even-side data are output from the data buses DB10-0 to DB10-3. The odd-side data are output from the data buses DB10-4 to DB10-7. The output of the even-side data is described here. The output of the odd-side data is similar to that of the even-side data, and is therefore not described.

The core circuit 10 outputs data to the FIFO 20 via the data buses DB10-0 to DB10-3. A clock signal PICLK, and a clock CLKA-0 to a clock CLKA-3 that are frequency-divided into four are supplied to the FIFO 20.

The FIFO 20 sequentially holds data output from the core circuit 10 synchronously with the clock signal PICLK. Specifically, the FIFO 20 holds data a, b, c, and d (DATA-0) synchronously with a first clock of the clock signal PICLK. The FIFO 20 then holds data 0, 1, 2, and 3 (DATA-1) synchronously with a second clock of the clock signal PICLK. The FIFO 20 then holds data 4, 5, 6, and 7 (DATA-2) synchronously with a third clock of the clock signal PICLK. The FIFO 20 subsequently holds data in a similar manner, and holds data W, X, Y, and Z (DATA-7) synchronously with an eighth clock of the clock signal PICLK. Consequently, the FIFO 20 holds even-side 4-byte data. If odd-side data input via the data buses DB10-4 to DB10-7 are put together, the FIFO 20 holds, for example, 8-byte data. Here, the data holding capacity is 8 bytes because only 8 bits of the 64-bit bus width of the FIFO 20 are shown here. However, the data holding capacity of the whole FIFO 20 is 64 bytes.

The read enable signal (clock signal) REn input from the outside is supplied to the frequency division circuit 33 and the multiplexer 32. The frequency division circuit 33 frequency-divides the read enable signal REn, and generates four clock signals CLKB-0, CLKB-1, CLKB-2, and CLKB-3. These clock signals CLKB-0 to CLKB-3 are supplied to the pulse width adjusting circuit 34, the FIFO 30-0, and the multiplexers 31e and 31o. The clock signal including the clock signals CLKB-0 to CLKB-3 is hereinafter denoted by CLKB.

The pulse width adjusting circuit 34 adjusts the pulse widths of the clock signals CLKB-0 to CLKB-3, and respectively generates the clock signals CLKA-0, CLKA-1, CLKA-2, and CLKA-3. These clock signals CLKA-0 to CLKA-3 are supplied to the FIFO 20 and the FIFO 30-0. Although the clock signals CLKA-0 to CLKA-3 are indicated by the same waveforms as the clock signals CLKB-0 to CLKB-3 for convenience of explanation in FIG. 6, different waveforms are actually used. The clock signal including the clock signals CLKA-0 to CLKA-3 is hereinafter denoted by CLKA.

The FIFO 20 then sequentially outputs the held data to the FIFO 30-0 synchronously with the clock signal CLKA. Specifically, the FIFO 20 outputs data "0" (DATA0) synchronously with the rise of a first-period clock (0) of the clock signal CLKA-0. The FIFO 20 then outputs data "1" (DATA1) synchronously with the rise of a first-period clock (1) of the clock signal CLKA-1. The FIFO 20 then outputs data "2" (DATA2) synchronously with the rise of a first-period clock (2) of the clock signal CLKA-2. The FIFO 20 further outputs data "3" (DATA3) synchronously with the rise of a first-period clock (3) of the clock signal CLKA-3. In the example shown here, data a, b, c, and d are already output before the FIFO 20 outputs the above-mentioned data 0, 1, 2, and 3.

Data output from the FIFO 20 are then held in the FIFO 30-0. The FIFO 30-0 holds data 0, 1, 2, and 3 synchronously with the clock signal CLKA. Specifically, the FIFO 30-0 holds data "0" (DATA0) synchronously with the rise of the first-period clock (0) of the clock signal CLKA-0. The FIFO 30-0 then holds data "1" (DATA1) synchronously with the rise of the first-period clock (1) of the clock signal CLKA-1. The FIFO 30-0 then holds data "2" (DATA2) synchronously with the rise of the first-period clock (2) of the clock signal CLKA-2. The FIFO 30-0 further holds data "3" (DATA3) synchronously with the rise of the first-period clock (3) of the clock signal CLKA-3.

In the meantime, the odd-side data are input to the FIFO 30-0 by the input/output operation similar to that for the above-described even-side data. Note that the FIFO 30-0 holds, for example, even-side 4-bit data and odd-side 4-bit data, and holds a total of 8-bit (1-byte) data. The FIFOs 30-0 to 30-7 hold 8-byte data all together.

The FIFO 30-0 and the multiplexers 31e and 31o then output data held in the FIFO 30-0 synchronously with the clock signal CLKB, and select and output one of these data. Consequently, the multiplexer 31e outputs even-side data (DATA-e) synchronously with the clock signal CLKB. In the meantime, the multiplexer 31o outputs odd-side data (DATA-o) synchronously with the clock signal CLKB.

Specifically, the multiplexer 31e outputs data "a" (DATA-e) synchronously with the rise of a first-period clock (a) of the clock signal CLKB-0. The multiplexer 31e then outputs data "b" (DATA-e) synchronously with the rise of a first-period clock (b) of the clock signal CLKB-1. The multiplexer 31e then outputs data "c" (DATA-e) synchronously with the rise of a first-period clock (c) of the clock signal CLKB-2. The multiplexer 31e further outputs data "d" (DATA-e) synchronously with the rise of a first-period clock (d) of the clock signal CLKB-3.

In the meantime; the multiplexer 31o outputs data "a" (DATA-o) synchronously with the rise of the first-period clock (a) of the clock signal CLKB-0. The multiplexer 31o then outputs data "b" (DATA-o) synchronously with the rise of the first-period clock (b) of the clock signal CLKB-1. The multiplexer 31o then outputs data "c" (DATA-o) synchronously with the rise of the first-period clock (c) of the clock signal CLKB-2. The multiplexer 31o further outputs data "d" (DATA-o) synchronously with the rise of the first-period clock (d) of the clock signal CLKB-3.

The even-side data output from the multiplexer 31e is then input to the multiplexer 32. In the meantime; the odd-side data output from the multiplexer 31o is also input to the multiplexer 32.

The multiplexer 32 outputs data input to the multiplexer 32 to the input/output pad 40-0 synchronously with the read enable signal REn. Specifically, the multiplexer 32 outputs the even-side data "a" (DATA-e) synchronously with the rise of a clock (a) of the read enable signal REn. The multiplexer 32 outputs the odd-side data "a" (DATA-o) synchronously with the fall of the clock (a) of the read enable signal REn.

The multiplexer 32 then outputs the even-side data "b" (DATA-e) synchronously with the rise of a clock (b) of the read enable signal REn. The multiplexer 32 outputs the odd-side data "b" (DATA-o) synchronously with the fall of the clock (b) of the read enable signal REn. Similarly, the multiplexer 32 outputs the even-side and odd-side data "c", "d", . . . , "3", . . . synchronously with the rises and falls of clocks (c), (d), . . . , (3), . . . of the read enable signal REn. Although the even-side and odd-side data are indicated by the same marks "a", "b", "c", . . . , the even-side and odd-side data may have different values.

In the example that has been shown, the bus width between the core circuit 10 and the FIFO 20 and between the FIFO 20 and the FIFOs 30-0 to 30-7 is 64 bits, and the bus width between the FIFO 20 and each of the FIFOs 30-0 to 30-7 is 8 bits. However, the bus widths are not limited. The bus widths can be freely changed depending on mounting forms.

In the example that has been shown, the data holding capacity in the FIFO 20 in FIG. 7 is 8 bytes, the data holding capacity in the FIFO 30-0 is 1 byte, the data holding size in the FIFO 20 in FIGS. 1 and 4 is 64 bytes, and the data holding size of the FIFOs 30-0 to 30-7 put together is 8 bytes. However, the data holding sizes are not limited. The data holding sizes of the first FIFO 20 and the FIFOs 30 can be freely changed depending on mounting forms.

1.5 Effects of First Embodiment

In the first embodiment, the first FIFO 20 and the second FIFOs 30 are disposed between the memory circuit which outputs data and the input/output pads (or input/output circuits), the first FIFO 20 synchronizes the output data of the memory circuit with the read clock (output clock), and the second FIFOs 30 again synchronize the output data of the first FIFO 20 with the read clock. As a result, the asynchrony of the read clock and the output data can be reduced.

Furthermore, the second FIFO 30 is disposed in the vicinity of each of the input/output pads (or input/output circuits), and the second FIFO 30 synchronizes the output data of the input/output pad with the read clock. As a result, the asynchrony of the output data of the input/output pad and the read clock can be effectively reduced.

Advantageous effects of the first embodiment are described below in detail by the use of a comparative example shown in FIG. 8. In this comparative example, data held in the FIFO 20 are synchronously output to the multiplexers 31e and 31o by the clock signal CLKA. Further, data input to the multiplexers 31e and 31o are selected by the multiplexers 31e and 31o, and then output to the multiplexer 32.

In such a comparative example, the distance from the multiplexers 31e and 31o to the multiplexer 32 is much longer than that in the first embodiment. Thus, data output from the multiplexers 31e and 31o increase the asynchrony of the read clock and the output data during the transfer to the multiplexer 32 because of the resistance and capacitance of the interconnect line, the increase in the number of stages of redrivers, or power-supply noise. This asynchrony needs to be minimized in a circuit which performs high-speed data transfer.

According to the first embodiment, after the output data of the memory circuit is synchronized by the first FIFO, the output data of the first FIFO is again synchronized by the second FIFOs disposed in the vicinity of the input/output pads. As a result, the asynchrony of the read clock and the output data can be reduced.

Furthermore, the distance from the second FIFOs to the input/output pads is extremely short, so that it is possible to reduce the resistance and capacitance of the interconnect line, reduce the number of stages of redrivers for the read clock and data output, and reduce the power-supply noise. Moreover, the distance between the second FIFOs and the input/output pads can be reduced, so that it is possible to reduce jitters of transferred data and the read clock, and reduce the variation of the duty cycle.

2. Second Embodiment

A semiconductor device according to a second embodiment is described. While the second FIFOs are disposed in the vicinity of the input/output pads at the subsequent stage of the first FIFO in the first embodiment, the first FIFO is disposed in the vicinity of the input/output pads in the example shown in the second embodiment.

2.1 Configuration from Core Circuit to Input/Output Circuit

FIG. 9 is a diagram showing the detailed configuration from the core circuit to one input/output pad according to the second embodiment. In this semiconductor device, the FIFO 20 is disposed in the vicinity of the input/output pad (or input/output circuit) 40-0. Data output from the core circuit 10 is input to the FIFO 20 in the vicinity of the input/output pad 40-0, and held in the FIFO 20. The FIFO 20 then outputs the held data to the multiplexers 31e and 310 synchronously with the clock signal CLKB. Data input to the multiplexers 31e and 310 are selected by the multiplexers 31e and 310 and the multiplexer 32, and then output to the input/output pad 40-0.

Data output from the core circuit 10 is directly held in the FIFO 20, so that the capacity of the FIFO 20 to hold data is 64 bits or more. The configuration and operation are similar in other respects to those in the first embodiment.

2.2 Effects of Second Embodiment

In the second embodiment, the output data of the memory circuit is synchronized by the FIFO 20 disposed in the vicinity of the input/output pad (or input/output circuit). As a result, the asynchrony of the read clock and the output data can be reduced.

In this case, data output from the core circuit 10 is synchronized with the read clock and output by the FIFO 20, so that it is possible to hold, for example, 64 bits or more of data in the same manner as the first FIFO 20 used in the first embodiment. Moreover, the FIFO 20 is disposed in the vicinity of the input/output pad, so that it is not necessary to adjust the pulse width of the clock signal CLKB. Therefore, the pulse width adjusting circuit 34 used in the first embodiment is eliminated. The configuration and advantageous effects are similar in other respects to those in the first embodiment.

3. Modifications, Etc.

Although the memory circuit 11 described in the first embodiment includes the NAND flash memory, the memory circuit 11 is not limited to this, and the memory circuit 11 is applicable to various types of semiconductor storage devices regardless of a volatile memory or a nonvolatile memory. For example, it is also possible to apply to a magnetoresistive random access memory (MRAM), a resistive random access memory (ReRAM), or a phase-change random access memory (PCRAM).

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor device comprising:
    a plurality of memory chips, each memory chip having opposite surfaces extending in a first direction and a second direction, the memory chips being stacked in a third direction, the first to third directions crossing one another, each memory chip including an interconnect extending therethrough between the opposite surfaces in the third direction;
    an interface chip being disposed to face a lowermost one of the memory chips in the third direction; and
    a plurality of conductive members disposed between the memory chips and the interface chip to thereby electrically connect in the third direction,
    wherein the interface chip includes:
        a first FIFO receiving data from the lowermost one of the memory chips through the interconnect thereof;
        a second FIFO receiving the data from the first FIFO; and
        a pad outputting the data from the second FIFO, and
    wherein, in the interface chip,
        the second FIFO is positioned closer to the pad as compared with the first FIFO.

2. The semiconductor device according to claim 1, wherein in the interface chip, as viewed from above,
    the first FIFO is positioned closer to a center of the interface chip as compared with the pad, and
    the second FIFO is positioned closer to one side of the interface chip as compared with the first FIFO.

3. The semiconductor device according to claim 1, wherein
    the first FIFO receives the data of a plurality of bits from the lowermost one of the memory chips,
    the second FIFO includes a plurality of second FIFOs receiving the data from the first FIFO, and
    the pad includes a plurality of pads outputting the data by receiving the data from the plurality of second FIFOs, respectively.

4. The semiconductor device according to claim 3, wherein
    in the interface chip,
        at least part of the plurality of second FIFOs are provided along the first direction,
        at least another part of the plurality of second FIFOs are provided along the first direction, and
        the first FIFO is provided between the part of the plurality of second FIFOs and the another part of the plurality of second FIFOs in the second direction.

5. The semiconductor device according to claim 4, wherein
    at least part of the pads are provided along the first direction at a first edge portion on one surface of the interface chip,
    at least another part of the pads are provided along the first direction at a second edge portion on the one surface of the interface chip, and
    the first edge portion and the second edge portion are opposite from each other in the second direction.

6. The semiconductor device according to claim 4, wherein
    the pads are located on one surface of the interface chip in the vicinity of the plurality of second FIFOs, respectively.

7. The semiconductor device according to claim 6, wherein
the first FIFO and the plurality of second FIFOs are provided between the part of the pads and the another part of the pads in the second direction.

8. The semiconductor device according to claim 6, wherein
a distance between one of the plurality of second FIFOs and a corresponding one of the pads is smaller in physical layout than a distance between the one of the plurality of second FIFOs and another one of the pads.

9. The semiconductor device according to claim 3, wherein
the first FIFO receives the data from the lowermost one of the memory chips and outputs the data in synchronism with a first clock.

10. The semiconductor device according to claim 9, wherein
data output from one of the pads is synchronized with a second clock signal, and
the semiconductor device further comprises a frequency division circuit frequency dividing the second clock signal to thereby generate the first clock signal.

11. The semiconductor device according to claim 10, further comprising
a multiplexer disposed between the first FIFO and the one of the pads, the multiplexer outputting the data at a rise and a fall of the second clock signal.

12. The semiconductor device according to claim 1, wherein
the conductive members include
a first bump provided on one surface of the lowermost one of the memory chips to be electrically connected with the interconnect; and
a plurality of second bumps provided on one surfaces of the remaining ones of the memory chips to be electrically connected with the interconnects, respectively,
wherein the memory chips and the interface chip are electrically connected through the interconnects, the first bump and the plurality of second bumps.

13. The semiconductor device according to claim 1, wherein
a bus width between the lowermost one of the memory chips and the interface chip is the same as a bus width of the first FIFO in the interface chip.

14. The semiconductor device according to claim 1, wherein
each memory chip includes a memory circuit which outputs the data.

\* \* \* \* \*